United States Patent
Lu et al.

(10) Patent No.: US 7,537,677 B2
(45) Date of Patent: May 26, 2009

(54) METHOD OF MAKING LOW-E COATING USING CERAMIC ZINC INCLUSIVE TARGET, AND TARGET USED IN SAME

(75) Inventors: Yiwei Lu, Ann Arbor, MI (US); Thomas A. Seder, Northville, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 121 days.

(21) Appl. No.: 11/037,452

(22) Filed: Jan. 19, 2005

(65) Prior Publication Data

US 2006/0159932 A1    Jul. 20, 2006

(51) Int. Cl.
C23C 14/34 (2006.01)
(52) U.S. Cl. .............................. 204/192.27; 204/192.26
(58) Field of Classification Search ............ 204/192.26, 204/192.27, 192.28, 192.29
See application file for complete search history.

(56) References Cited

U.S. PATENT DOCUMENTS

| | | | | |
|---|---|---|---|---|
| 5,413,864 | A * | 5/1995 | Miyazaki et al. | ............ 428/432 |
| 5,532,062 | A | 7/1996 | Miyazaki et al. | |
| 5,849,108 | A * | 12/1998 | Kariya et al. | ............... 136/265 |
| 5,962,115 | A * | 10/1999 | Zmelty et al. | ............... 428/216 |
| 6,107,116 | A | 8/2000 | Kariya et al. | |
| 6,398,925 | B1 | 6/2002 | Arbab et al. | |
| 6,562,490 | B2 | 5/2003 | Ebisawa et al. | |
| 6,596,135 | B1 | 7/2003 | Mitsui | |
| 6,743,343 | B2 | 6/2004 | Kida et al. | |
| 6,800,182 | B2 | 10/2004 | Mitsui et al. | |
| 2002/0102352 | A1* | 8/2002 | Hartig et al. | ................. 427/165 |
| 2003/0150711 | A1 | 8/2003 | Laird | |
| 2003/0194567 | A1 | 10/2003 | Lingle et al. | |
| 2003/0198816 | A1 | 10/2003 | Lingle et al. | |
| 2004/0005467 | A1 | 1/2004 | Neuman et al. | |
| 2004/0121165 | A1 | 6/2004 | Laird | |
| 2004/0180214 | A1 | 9/2004 | Laird et al. | |

FOREIGN PATENT DOCUMENTS

| | | |
|---|---|---|
| EP | 0 464 789 | 1/1992 |
| EP | 0 698 929 | 2/1996 |
| JP | 62-041740 | 2/1987 |
| JP | 2001-022110 | * 1/2001 |
| WO | WO 03/093185 A1 | * 11/2003 |

OTHER PUBLICATIONS

Machine Translation of 2001-022110. Publication Date Jan. 2001.*
"Method and Multichamber Apparatus to Coat a Glass Substrate With a Multilayer SnO/ZnO/Ag/CrNOx" Valentino et al., EP1371745, Dec. 17, 2003.
"Magnetron Sputtering of Transparent Conductive Zinc Oxide: relation between the sputtering parameters and the electronic properties", Ellmer; J. Phys. D: Appl. Phys. 33 (2000) R17-R32.

* cited by examiner

Primary Examiner—Rodney G McDonald
(74) Attorney, Agent, or Firm—Nixon & Vanderhye P.C.

(57) ABSTRACT

A ceramic target is used in sputter-depositing a contact layer adjacent an infrared (IR) reflecting layer in certain example embodiments. For example, a $ZnO_x$ ceramic target may be used in sputter-depositing a zinc oxide inclusive layer over and/or under a silver based IR reflecting layer in certain embodiments. In certain example embodiments, the ceramic target may be doped with a non-metal such as F and/or B.

15 Claims, 3 Drawing Sheets

METHOD OF MAKING LOW-E COATING USING CERAMIC ZINC INCLUSIVE TARGET, AND TARGET USED IN SAME

Certain example embodiments of this invention relate to a method of making a coated article including a low-E (low emissivity) coating supported by a glass substrate. In certain example embodiments, at least one layer comprising zinc oxide is provided adjacent and contacting an infrared (IR) reflecting layer. A ceramic zinc inclusive target is used in sputter-depositing the layer comprising zinc oxide. In certain example embodiments, the ceramic zinc inclusive target may be substoichiometric and/or doped with a non-metal such as fluorine (F).

BACKGROUND AND SUMMARY OF THE INVENTION

Coated articles including low-E coatings are known in the art. For example, see U.S. 2004/0180214, 2004/0005467, 2003/0150711 and 2004/0121165, the disclosures of which are hereby incorporated herein by reference. Low-E coatings typically include one or more IR reflecting layers of a material such as silver or the like. It is known to sputter-deposit a silver IR reflecting layer on and contacting a contact layer of zinc oxide (e.g., see 2003/0150711 and 2004/0121165).

IR reflecting layers such as silver layers are typically deposited by sputtering a silver target in an atmosphere of argon (Ar) gas. This argon atmosphere is used to deposit an IR reflecting layer in a manner so as to reduce any possible oxidation of the same. Oxidation of the silver IR reflecting layer is often viewed as undesirable in that it can sometimes lead to failure and/or undesirable changing of the characteristics of the IR reflecting layer. In an effort to reduce oxidation of silver IR reflecting layers, metal contact layers such as NiCr, Ti or the like are often deposited immediately over silver IR reflecting layers; this may help to reduce oxidation of the silver layer when a further metal oxide layer is sputter-deposited over the metal contact layer of NiCr, Ti or the like. However, the use of metal contact layers is not always desirable, in that they tend to lead to decreased transmission of the coated article and/or significant changes in appearance upon heat treatment such as thermal tempering.

It is also known in the art to use zinc oxide as a contact layer immediately adjacent silver. The traditional way to sputter-deposit zinc oxide in the manufacture of coated articles is to sputter a Zn based metal (or metal alloy) target in an atmosphere saturated with oxygen gas. However, the large amounts of oxygen gas used in traditional sputtering of metal Zn inclusive targets may have a negative impact on the silver which is adjacent the zinc oxide. In particular, due to the use of large amounts of oxygen gas in sputtering zinc adjacent silver, oxygen gas may tend to leak from the zinc sputtering chamber into the adjacent silver sputtering chamber or bay thereby leading to undesirable oxidation of the silver IR reflecting layer. Another possible problem is that a surface of the silver layer may be exposed to oxygen gas as the coating enters and begins to pass through the zinc sputtering chamber. The existence of oxygen tends to degrade silver IR reflecting layers by forming AgO which has a high absorption in the visible spectrum and low reflecting in the IR spectrum. This undesirable phenomenon is particularly detrimental for low-E coatings having thin silver layer such as less than about 150 Å thick.

In order to address the aforesaid problem, it is known to use a ceramic target (or ceramic cathode) to sputter-deposit a zinc oxide contact layer above and contacting a silver IR reflecting layer. For instance, a ZnO target (which is a ceramic target) may be doped with a material such as Al, and sputtered in order to form such a zinc oxide based layer over an IR reflecting layer. The Al is provided in the target in order to make the target conductive enough for efficient sputtering. Ceramic ZnO targets are desirable in that to form a zinc oxide layer which a particular stoichiometry, less oxygen gas is needed in the sputtering atmosphere around the ceramic target because oxygen is already present in the target itself; thereby reducing the likelihood of the adjacent silver IR reflecting layer being damaged by oxygen gas used in sputtering a zinc oxide contact layer. However, it is sometimes not desirable to dope ceramic targets with a metal such as Al, since the Al tends to end up in the deposited layer in significant amounts which may not be desired in certain situations. Unfortunately, if a stoichiometric ZnO target (i.e., $ZnO_x$, where x=1) is not so doped, its conductivity is less than what is needed for efficient sputtering.

In view of the above, it will be apparent that there exists a need in the art for an improved technique for forming zinc oxide inclusive layers, especially adjacent and contacting IR reflecting layers such as silver.

It has been found that the use of a substoichiometric zinc oxide ceramic target is advantageous in this regard. According to certain example embodiments of this invention, a substoichiometric ceramic target comprising $ZnO_x$ (e.g., where $0.25 \leq x \leq 0.99$, more preferably $0.50 \leq x \leq 0.97$, and even more preferably $0.70 \leq x \leq 0.96$) is used in sputter-depositing a zinc oxide inclusive contact layer which is located, or is to be located, adjacent and contacting an IR reflecting layer of silver or the like (substoichiometric means that "x" is less than 1.0 in the case of $ZnO_x$).

According to certain example embodiments of this invention, the substoichiometric nature of the $ZnO_x$ inclusive ceramic target causes the ceramic target to be more conductive, thereby reducing or eliminating the need for metal dopant(s) in the target. In particular, with no metal doping, a substoichiometric $ZnO_x$ inclusive ceramic target is able to realize improved sputtering yields and faster sputtering rates compared to a stoichiometric ZnO ceramic target. This is highly advantageous as will be appreciated by those of skill in the art. In certain example embodiments of this invention, no dopants are needed for a substoichiometric $ZnO_x$ inclusive ceramic target.

In certain example embodiments of this invention, a substoichiometric $ZnO_x$ inclusive ceramic target may be doped with a non-metal such as F and/or B. F and/or B when used as dopants increase the electrical conductivity of the target, which may be needed in certain situations where x is close to 1.0 even while the target is still slightly substoichiometric. In certain example embodiments of this invention, the target may be doped so as to include from about 0.5 to 5.0% F and/or B, more preferably from about 0.5 to 3% F and/or B (atomic %). In certain alternative embodiments of this invention, a stoichiometric ZnO ceramic target may be doped with from about 0.5 to 5.0% F and/or B, more preferably from about 0.5 to 3% F and/or B.

Such ceramic zinc oxide/suboxide sputtering targets may be used to sputter-deposit ZnO layers in low oxygen environments (i.e., a low amount of oxygen gas is required in the sputtering chamber or bay where the target(s) is located) using either AC or DC sputtering. In certain example embodiments of this invention, no more than about 40%, more preferably no more than about 30%, and most preferably no more than about 20% of the total gas in the sputtering chamber including the ceramic target is oxygen; the remainder of the gas in the sputtering chamber may be argon or the like. Due to the low percentage of $O_2$ gas, the degradation of silver properties can be reduced and/or avoided when the zinc oxide is formed adjacent and contacting a silver based layer.

In certain example embodiments of this invention, there is provided a method of making a coated article including a coating supported by a glass substrate, the method comprising: depositing an infrared (IR) reflecting layer on the substrate; sputtering a ceramic target comprising zinc oxide in forming a first layer comprising zinc oxide on the substrate, where the layer comprising zinc oxide directly contacts the IR reflecting layer and is located above or below the IR reflecting layer; and wherein the zinc oxide of the ceramic target is substoichiometric.

In other example embodiments of this invention, there is provided a method of making a coated article including a coating supported by a glass substrate, the method comprising: depositing an infrared (IR) reflecting layer on the substrate; sputtering a target comprising zinc oxide in forming a first layer comprising zinc oxide on the substrate, where the layer comprising zinc oxide directly contacts the IR reflecting layer and is located above or below the IR reflecting layer; and wherein the zinc oxide of the target is doped with from about 0.5 to 5.0% fluorine. In such fluorine inclusive embodiments, the ceramic target may or may not be substoichiometric.

In still further example embodiments of this invention, there is provided a method of making a coated article including a coating supported by a glass substrate, the method comprising: depositing an infrared (IR) reflecting layer on the substrate; sputtering a target comprising zinc in forming a first layer comprising zinc oxide on the substrate, where the layer comprising zinc oxide directly contacts the IR reflecting layer and is located above or below the IR reflecting layer; and wherein the target comprising zinc is doped with boron. In such boron inclusive embodiments, the target may or may not be stoichiometric, and the target may or may not be ceramic.

In still further example embodiments of this invention, there is provided a sputtering target comprising a material to be sputtered from the target, the material comprising one or more of: (a) substoichiometric zinc oxide; (b) zinc, or zinc oxide, doped with boron; and (c) zinc oxide doped with from about 0.5 to 5.0% fluorine.

In still further example embodiments of this invention, there is provided a coated article comprising a multi-layer coating supported by a glass substrate, the coating comprising: at least one IR reflecting layer comprising silver; a layer comprising zinc oxide located above or below the IR reflecting layer, wherein the layer comprising zinc oxide directly contacts the IR reflecting layer; and wherein the layer comprising zinc oxide is doped with one or more of: (a) from about 0.5 to 5.0% fluorine, (b) from about 0.5 to 10.0% boron. Another similar layer comprising zinc oxide doped with F and/or B may be located on the other side of the IR reflecting layer, and/or adjacent and contacting another IR reflecting layer.

DETAILED DESCRIPTION OF EXAMPLE EMBODIMENTS OF THE INVENTION

Figure 1:
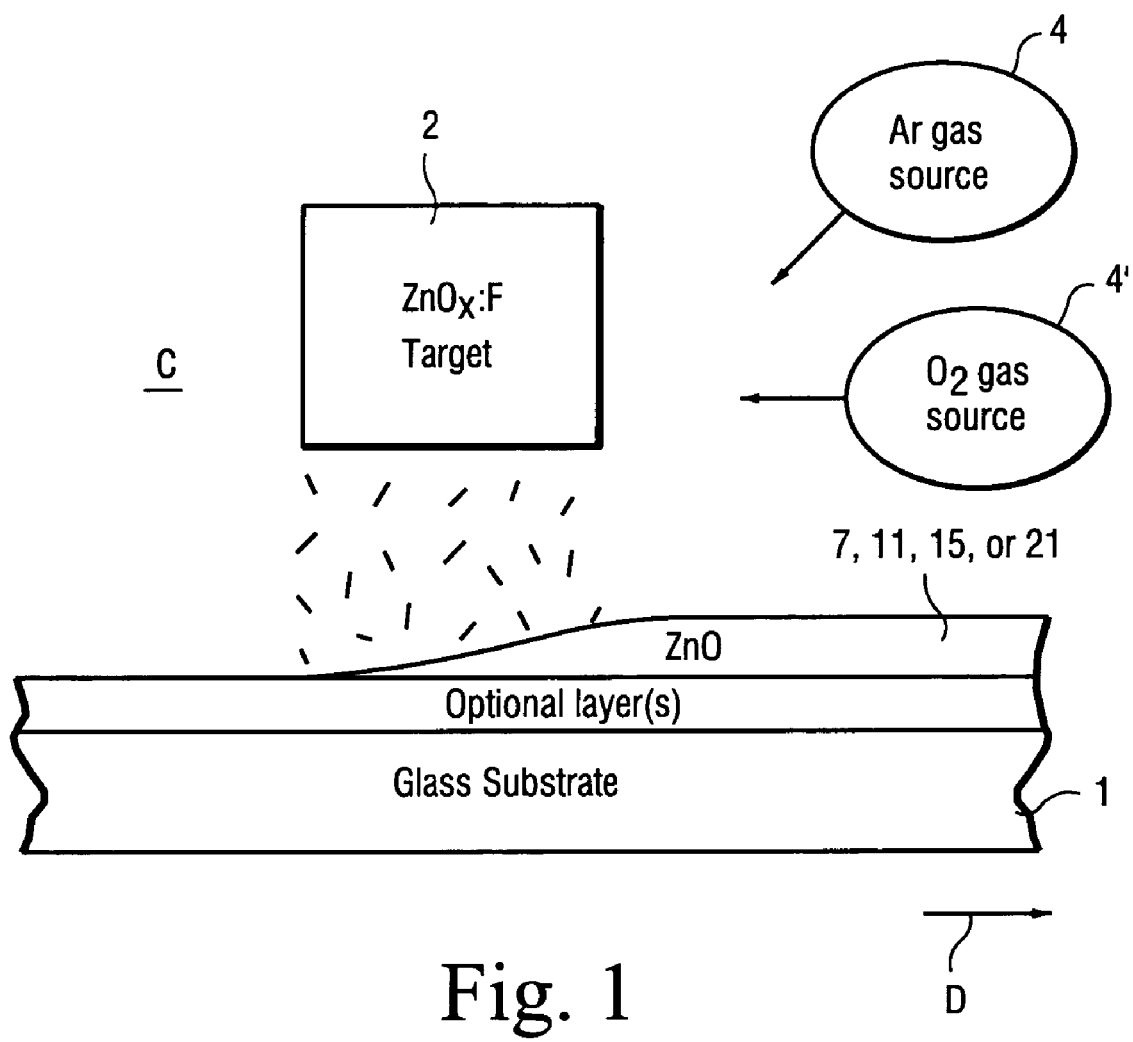
FIG. 1 is a schematic diagram illustrating a ceramic zinc oxide inclusive target being used in sputter-depositing a zinc oxide inclusive layer according to an example embodiment of this invention.

Referring now more particularly to the accompanying drawings in which like reference numerals indicate like parts throughout the several views.

Coated articles herein may be used in applications such as monolithic windows, IG window units, vehicle windows, and/or any other suitable application that includes single or multiple substrates such as glass substrates. Coated articles according to different embodiments of this inventions may or may not be heat treated (e.g., thermally tempered). Coated articles according to certain example embodiments of this invention may include single silver low-E (low-emissivity) coatings, or alternatively double-silver or triple-silver low-E coatings.

Silver inclusive infrared (IR) reflecting layers are commonly used in low-E coatings. According to certain example embodiments of this invention, a contact layer(s) comprising ZnO is located immediately above and/or below a silver inclusive IR reflecting layer so as to contact the IR reflecting layer. The ZnO may be doped with a non-metal such as F and/or B in certain example embodiments of this invention. Certain zinc oxide based layers typically have a lattice distance similar to (111) oriented silver. Due to this similarity in lattice distance, a zinc oxide based contact layer atop (as a protective layer) and/or beneath (as a seed layer) a silver based IR reflecting layer is advantageous in that it assists in the formation of desired silver crystallinity. This enhances the silver packing density which results in low absorption in the visible spectrum and high reflection in the IR spectrum which are desirable features in many low-E coatings.

FIG. 1 is a schematic diagram illustrating a zinc oxide inclusive layer (7, 11, 15 or 21, see possible layers in FIG. 2) being sputter-deposited on a glass substrate 1 using a ceramic zinc oxide inclusive target 2. The glass substrate 1 proceeds (e.g., via a conveyor) in direction D under the ceramic target 2, and material (e.g., ZnO) sputtered from the target 2 and falls or is otherwise directed toward the substrate 1 to form the zinc oxide inclusive layer thereon as shown in FIG. 1. The zinc oxide inclusive layer may be formed so as to contact the substrate 1, or alternatively may be formed on the substrate 1 with other layer(s) between the substrate 1 and the zinc oxide inclusive layer as shown in FIG. 1. While FIG. 1 illustrates the use of a target 2 comprising zinc oxide doped with fluorine to form a zinc oxide layer (one or more of 7, 11, 15 and 21), the FIG. 3 embodiment illustrates that the target 2 may be doped with boron instead of fluorine in certain embodiments of this invention.

It has been found that the use of a substoichiometric zinc oxide ceramic target 2 is advantageous. According to certain example embodiments of this invention, at least one substoichiometric ceramic target 2 comprising $ZnO_x$ (e.g., where $0.25 \leq x \leq 0.99$, more preferably $0.50 \leq x \leq 0.97$, and even more preferably $0.70 \leq x \leq 0.96$) is used in sputter-depositing a zinc oxide inclusive contact layer(s) (7, 11, 15 or 21) which is to contact an IR reflecting layer of silver, gold, or the like (substoichiometric means that "x" is less than 1.0 in the case of $ZnO_x$). According to certain example embodiments of this invention, the substoichiometric nature of the $ZnO_x$ inclusive ceramic target 2 causes the ceramic target 2 to be more conductive, thereby reducing or eliminating the need for metal dopant(s) in the target 2. In particular, with no metal doping, a substoichiometric $ZnO_x$ inclusive ceramic target 2 is able to realize improved sputtering yields and faster sputtering rates compared to a stoichiometric ZnO ceramic target. This is highly advantageous as will be appreciated by those of skill in the art. In certain example embodiments of this invention, no dopants are needed for substoichiometric $ZnO_x$ inclusive ceramic target 2.

However, in certain example embodiments of this invention, a substoichiometric $ZnO_x$ inclusive ceramic target 2 is doped with a non-metal such as F and/or B. F and/or B when used as dopants increase the electrical conductivity of the target 2, which may be needed in certain situations where x is close to 1.0 even while the target is still slightly substoichiometric. In certain example embodiments of this invention, the target 2 may be doped so as to include from about 0.5 to 5.0% F and/or B, more preferably from about 0.5 to 3% F and/or B (atomic %). In certain alternative embodiments of this invention, a stoichiometric ZnO ceramic target 2 may be doped with from about 0.5 to 5.0% F and/or B, more preferably from about 0.5 to 3% F and/or B. In certain example embodiments, the target 2 may be doped with from about 0.5 to 10.0% boron. The increase in conductivity caused by the doping of the target 2 with F and/or B may also lead to an increase in the IR reflection of the resulting coating in certain example embodiments of this invention. If not enough F and/or B is provided, the target may suffer with respect to conductivity in certain situations, and if too much F and/or B is provided in the target film growth and functionality would become undesirable since too much F and/or B would end up in the sputter-deposited film and the adjacent silver would have undesirable properties. It is noted that the amounts of fluorine and/or boron in the target sputtering material tend to also end up in the resulting zinc oxide inclusive layer on the substrate in like amounts. The conductivity of the target or cathode mainly arises from dopant (e.g., B and/or F), and/or oxygen vacancy. However, if the dopant concentration is too high, the excessive dopants in the film may act as defects and reduce conductivity. So, an optimized dopant concentration in the target is desired in certain example non-limiting situations.

Such ceramic zinc oxide/suboxide sputtering target(s) 2 may be used to sputter-deposit ZnO layers (7, 11, 15 and/or 21) in low oxygen environments (i.e., a low amount of oxygen gas is required in the sputtering chamber or bay C where the target(s) is located) using either AC or DC sputtering. In the FIG. 1 embodiment, both oxygen and argon gas are introduced into the sputtering chamber C housing the target 2 via respective gas sources 4 and 4' In certain example embodiments of this invention, no more than about 40%, more preferably no more than about 30%, and most preferably no more than about 20% of the total gas (e.g., argon plus oxygen) in the sputtering chamber C including the ceramic target 2 is oxygen. In addition to the oxygen gas in the chamber C, the remainder of the gas in the sputtering chamber may be an inert gas such as argon or the like. Due to the low percentage of $O_2$ gas, the degradation of silver properties in the IR reflecting layer(s) can be reduced and/or avoided when the zinc oxide is formed adjacent and contacting a silver based IR reflecting layer.

In certain example embodiments of this invention, the $ZnO_x$:(A) target (where A is an optional non-metal dopant such as F and/or B) 2 can be fabricated by sintering, hot isostatic pressing, or thermal spraying using ZnO, Zn or a mixed powder of both. Such a target may be made up of $ZnO_x$, optionally with the addition of B or F as a dopant. The conductivity of the ceramic target 2 is controlled by (i) the density of the target, (ii) the amount of dopant (A), and (iii) the amount of oxidation of the zinc (i.e., the value x in $ZnO_x$). The ratio of ZnO/Zn powder, the dwelling time, and/or the amount of reduction and/or oxidation agent(s) used during target 2 manufacture determine the value x. As an example, a ceramic target 2 having a resistivity of less than 20 mΩ-cm suitable for magnetron sputtering can be fabricated in such a manner. Such a ceramic target (stoichiometric doped with F and/or B, or substoichiometric optionally doped with F and/or B) can be used to sputter-deposit zinc oxide inclusive dielectric or transparent conductive films in low oxygen environments in the manufacture of low-E coatings or the like. As discussed herein, the capability of depositing zinc oxide inclusive thin films in low oxygen environments is desirable in silver based low-E coatings having zinc oxide located adjacent and contacting silver layer(s).

Figure 2:
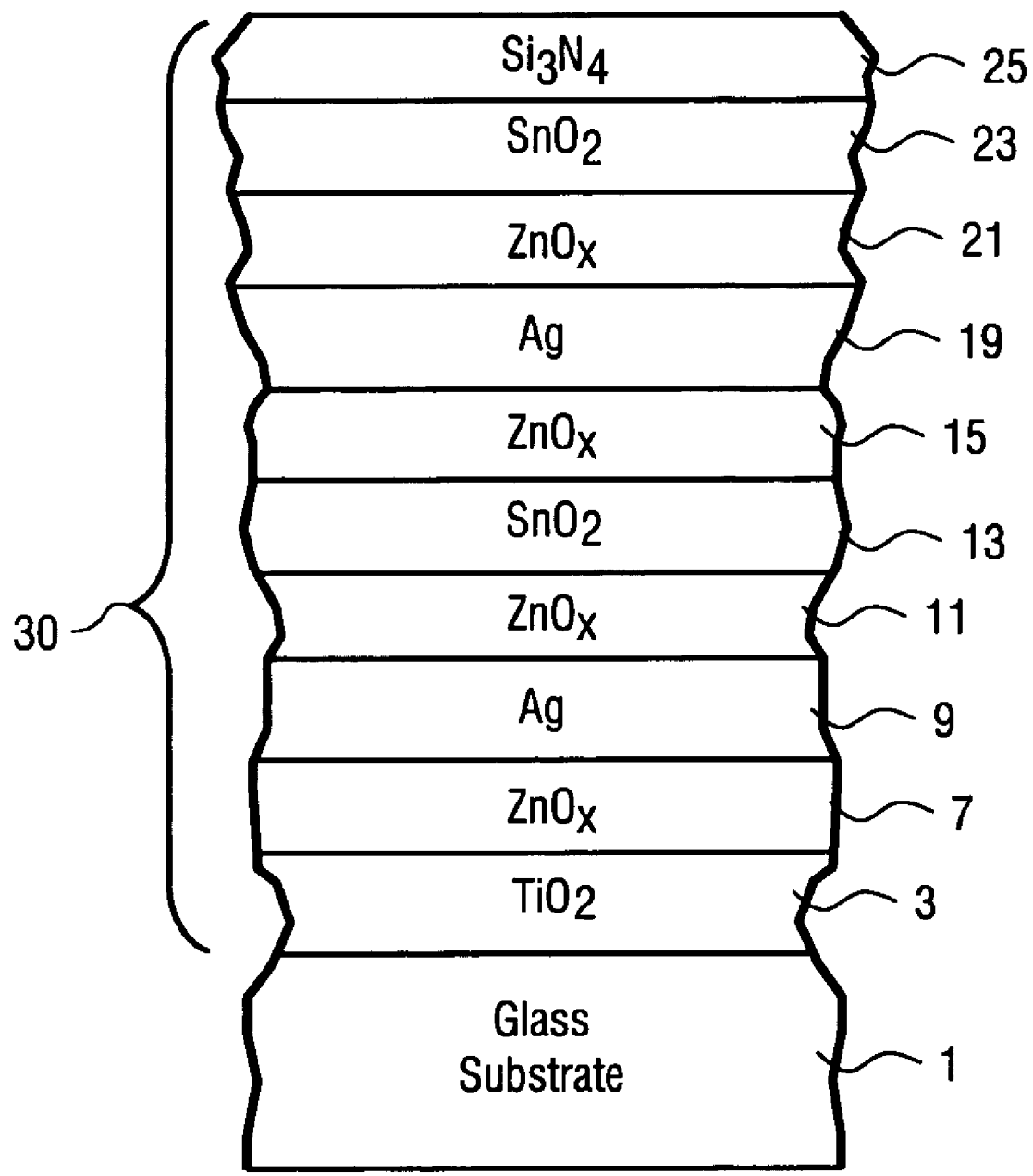
FIG. 2 is a cross sectional view of an example coated article according to an example embodiment of this invention.
Figure 3:
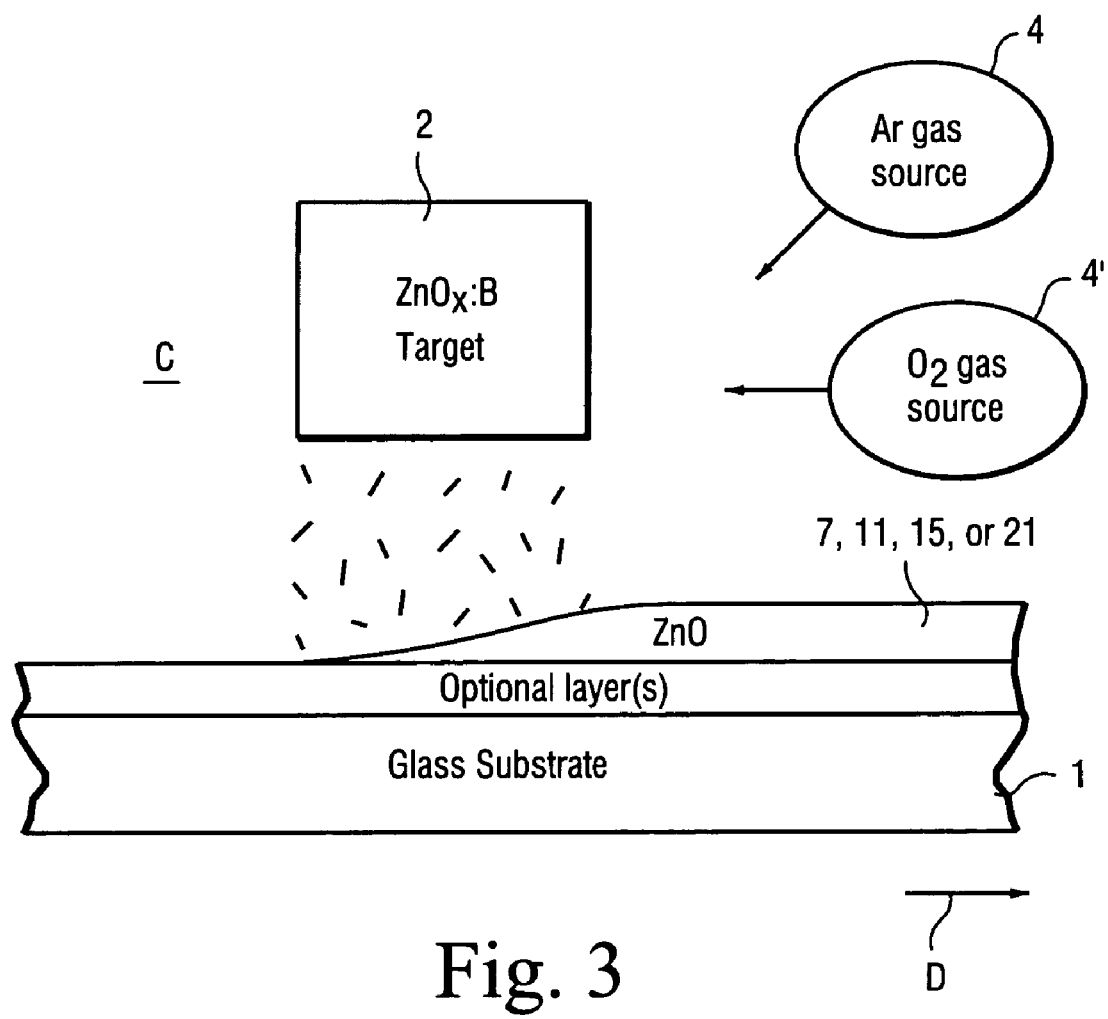
FIG. 3 is a schematic diagram illustrating a ceramic zinc oxide inclusive target being used in sputter-depositing a zinc oxide inclusive layer according to an example embodiment of this invention, where the target is doped with boron (this target may or may not be a ceramic).

FIG. 2 is a side cross sectional view of a coated article according to an example non-limiting embodiment of this invention. The coating of FIG. 2 is provided for purposes of example only, and is not intended to be limiting. The ceramic targets discussed herein may be used in the context of other non-illustrated coatings according to different embodiments of this invention.

Referring to FIG. 2, the example coated article includes substrate 1 (e.g., clear, green, bronze, or blue-green glass substrate from about 1.0 to 10.0 mm thick, more preferably from about 1.0 mm to 7.0 mm thick), and coating (or layer system) 30 provided on the substrate 1 either directly or indirectly. The coating (or layer system) 30 includes: dielectric titanium oxide layer 3 which may be $TiO_x$ (e.g., where x is from 1.5 to 2.0), first lower contact layer 7 (which contacts IR reflecting layer 9), first conductive and preferably metallic infrared (IR) reflecting layer 9, first upper contact layer 11 (which contacts layer 9), dielectric layer 13 (which may be deposited in one or multiple steps in different embodiments of this invention), second lower contact layer 15 (which contacts IR reflecting layer 19), second conductive and preferably metallic IR reflecting layer 19, second upper contact layer 21 (which contacts layer 19), dielectric layer 23, and finally protective dielectric layer 25. The "contact" layers 7, 11, 15 and 21 each contact at least one IR reflecting layer (e.g., layer based on Ag, Au or the like). The aforesaid layers 3-25 make up example low-E coating 30 which is provided on glass or plastic substrate 1.

In monolithic instances, the coated article includes only one glass substrate 1 as illustrated in FIG. 2. However, monolithic coated articles herein may be used in devices such as IG window units, or the like. As for IG window units, an IG window unit may include two or more spaced apart glass or plastic substrates. An example IG window unit is illustrated and described, for example, in U.S. Pat. No. 6,632,491, the disclosure of which is hereby incorporated herein by reference. An example IG window unit may include, for example, the coated glass substrate 1 shown in FIG. 2 coupled to another glass substrate (not shown) 2 via spacer(s), sealant(s) or the like with a gap being defined therebetween. This gap between the substrates in IG unit embodiments may in certain instances be filled with a gas such as argon (Ar). The gap may or may not be at a pressure less than atmospheric in different embodiments of this invention.

Dielectric layer 3 may be of or include titanium oxide in certain example embodiments of this invention. This layer is provided for anti-reflective purposes, and preferably has an index of refraction (n) of from about 2.0 to 2.6, more preferably from about 2.2 to 2.5. Layer 3 may be provided in direct contact with the glass substrate 1 in certain example embodiments of this invention, or alternatively other layer(s) may be provided between the substrate 1 and layer 3 in certain instances.

Infrared (IR) reflecting layers 9 and 19 are preferably substantially or entirely metallic and/or conductive, and may comprise or consist essentially of silver (Ag), gold, or any other suitable IR reflecting material. IR reflecting layers 9 and 19 help allow the coating to have low-E and/or good solar control characteristics. The IR reflecting layers 9 and/or 19 may, however, be slightly oxidized in certain embodiments of this invention.

One, two, three or four of contact layers 7, 11, 15 and 21 may consist essentially of or comprise zinc oxide (e.g., $ZnO_x$ where x is about 1) according to certain example embodiments of this invention. The zinc oxide of layer(s) 7, 11, 15 and/or 21 may contain other materials as well such as F and/or B for conductivity enhancement purposes as explained herein. In certain example embodiments, one or more of layers 7, 11, 15 and 21 is doped with from about 0.05 to 10% F and/or B, more preferably from about 0.5 to 5.0% F and/or B, and most preferably from about 0.5 to 3% F and/or B (atomic %). One, two, three or four of contact layers 7, 11, 15 and 21 may be sputter-deposited using at least one ceramic zinc oxide inclusive target 2 as discussed above.

Dielectric layer 13 may be of or include tin oxide in certain example embodiments of this invention. However, as with other layers herein, other materials may be used in different instances. Optional dielectric layer 23 may be of or include tin oxide in certain example embodiments of this invention. Dielectric layer 25, which may be an overcoat including one or more layers in certain example instances, may be of or include silicon nitride (e.g., $Si_3N_4$) or any other suitable material in certain example embodiments of this invention. Optionally, other layers may be provided above layer 25. For example, an overcoat layer of or including zirconium oxide (not shown) may be formed directly on top of the silicon nitride layer 25 in certain example embodiments of this invention. Silicon nitride layer 25 may be doped with Al or the like in certain example embodiments of this invention.

Other layer(s) below or above the illustrated coating may also be provided. Thus, while the layer system or coating is "on" or "supported by" substrate 1 (directly or indirectly), other layer(s) may be provided therebetween. Thus, for example, the coating of FIG. 2 may be considered "on" and "supported by" the substrate 1 even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention. Thus, the use of the word "on" herein is not limited to being in direct contact with.

While various thicknesses and materials may be used in layers in different embodiments of this invention, example thicknesses and materials for the respective layers on the glass substrate 1 in the FIG. 2 embodiment are as follows, from the glass substrate outwardly (the silver thicknesses are approximations based on deposition data):

Example Materials/Thicknesses; FIG. 1 Embodiment

| Layer | Preferred Range (Å) | More Preferred (Å) | Example (Å) |
|---|---|---|---|
| Glass (1-10 mm thick) | | | |
| $TiO_x$ (layer 3) | 10-450 Å | 50-250 Å | 90 Å |
| $ZnO_x$ (layer 7) | 10-300 Å | 40-150 Å | 90 Å |

-continued

Example Materials/Thicknesses; FIG. 1 Embodiment

| Layer | Preferred Range (Å) | More Preferred (Å) | Example (Å) |
|---|---|---|---|
| Ag (layer 9) | 50-250 Å | 60-120 Å | 95 Å |
| $ZnO_x$ (layer 11) | 10-300 Å | 40-150 Å | 90 Å |
| $SnO_2$ (layer 13) | 0-1,000 Å | 350-850 Å | 580 Å |
| $ZnO_x$ (layer 15) | 10-300 Å | 40-150 Å | 90 Å |
| Ag (layer 19) | 80-250 Å | 120-240 Å | 125 Å |
| $ZnO_x$ (layer 21) | 10-300 Å | 40-150 Å | 90 Å |
| $SnO_2$ (layer 23) | 0-750 Å | 100-300 Å | 90 Å |
| $Si_3N_4$ (layer 25) | 0-750 Å | 100-320 Å | 180 Å |

Coated articles including low-E coatings supported by glass substrates according to certain example embodiments of this invention have a visible transmission of at least 40%, more preferably at least 60%, and sometimes at least 70% according to certain example embodiments of this invention. Moreover, low-E coatings according to certain example embodiments of this invention may have a sheet resistance ($R_s$) of no greater than about 6 ohms/square, more preferably no greater than about 5 ohms/square, and most preferably no greater than about 4 ohms/square according to certain example embodiments of this invention.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A method of making a coated article including a coating supported by a glass substrate, the method comprising:
    depositing an infrared (IR) reflecting layer on the substrate;
    sputtering a ceramic target comprising zinc oxide in forming a first layer comprising zinc oxide on the substrate, where the layer comprising zinc oxide is a dielectric layer and directly contacts the IR reflecting layer and is located above or below the IR reflecting layer;
    wherein the zinc oxide of the ceramic target is substoichiometric; and
    wherein during said sputtering of the ceramic target oxygen and inert gas are provided in a sputtering chamber in which the ceramic target is being sputtered and where oxygen makes up no more than 20% of the total gas in the sputtering chamber in which the ceramic target is being sputtered, and wherein the ceramic target comprising zinc oxide is doped with from about 0.5 to 5.0% fluorine.

2. The method of claim 1, wherein the zinc oxide of the ceramic target is characterized by $ZnO_x$, where $0.25 \leq x \leq 0.99$.

3. The method of claim 1, wherein the zinc oxide of the ceramic target is characterized by $ZnO_x$, where $0.50 \leq x \leq 0.97$.

4. The method of claim 1, wherein the zinc oxide of the ceramic target is characterized by $ZnO_x$, where $0.70 \leq x \leq 0.96$.

5. The method of claim 1, wherein the first layer comprising zinc oxide is located above the IR reflecting layer, and wherein a second layer comprising zinc oxide is sputter-deposited so as to be located below and directly contacting the IR reflecting layer, wherein the second layer comprising zinc oxide is formed by sputtering a ceramic target comprising zinc oxide which is substoichiometric.

6. The method of claim 1, wherein the IR reflecting layer comprises silver.

7. The method of claim 1, wherein the ceramic target comprising zinc oxide is doped with from about 0.5 to 3% fluorine.

8. The method of claim 1, wherein the ceramic target comprising zinc oxide is further doped with from about 0.5 to 10.0% boron.

9. The method of claim 1, wherein the coated article has a sheet resistance ($R_s$) of no greater than about 6 ohms/square, and a visible transmission of at least about 40%.

10. The method of claim 1, wherein the target has a resistivity of less than 20 mΩ-cm.

11. The method of claim 1, wherein the dielectric layer comprising zinc oxide is sputter-deposited so as to be from 40-150 angstroms thick.

12. The method of claim 1, wherein the first layer comprising zinc oxide directly contacts the IR reflecting layer and is located below the IR reflecting layer, and wherein the IR reflecting layer comprises silver.

13. A method of making a coated article including a coating supported by a glass substrate, the method comprising:
 depositing an infrared (IR) reflecting layer on the substrate;
 sputtering a target comprising zinc oxide in forming a first layer comprising zinc oxide on the substrate, where the layer comprising zinc oxide is a dielectric layer and directly contacts the IR reflecting layer and is located above or below the IR reflecting layer;
 wherein the zinc oxide of the target is doped with from about 0.5 to 5.0% fluorine; and
 wherein during said sputtering of the target, oxygen and inert gas are provided in a sputtering chamber in which the target is being sputtered and where oxygen makes up no more than 20% of the total gas in the sputtering chamber in which the target is being sputtered.

14. The method of claim 13, wherein the zinc oxide of the target is doped with from about 0.5 to 3% fluorine.

15. The method of claim 13, wherein the coated article has a sheet resistance ($R_s$) of no greater than about 6 ohms/square, and a visible transmission of at least about 40%.

* * * * *